United States Patent
Moeller et al.

(10) Patent No.: US 11,255,803 B2
(45) Date of Patent: Feb. 22, 2022

(54) MEV-BASED ION BEAM ANALYSIS APPARATUS

(71) Applicant: Forschungszentrum Juelich GmbH, Juelich (DE)

(72) Inventors: Soeren Moeller, Merzenich (DE); Daniel Hoeschen, Aachen (DE); Sina Kurth, Cologne (DE); Albert Martin Hiller, Aldenhoven (DE); Christian Scholtysik, Euskirchen (DE); Gerwin Esser, Juelich-Guesten (DE); Christian Linsmeier, Bedburg (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 17/056,037

(22) PCT Filed: Mar. 27, 2019

(86) PCT No.: PCT/DE2019/000083
§ 371 (c)(1),
(2) Date: Nov. 17, 2020

(87) PCT Pub. No.: WO2019/219103
PCT Pub. Date: Nov. 21, 2019

(65) Prior Publication Data
US 2021/0080412 A1    Mar. 18, 2021

(30) Foreign Application Priority Data
May 18, 2018   (DE) ................. 10 2018 004 020.9

(51) Int. Cl.
*G01N 23/2257*   (2018.01)
*H01J 37/28*   (2006.01)
*H01J 37/30*   (2006.01)

(52) U.S. Cl.
CPC .......... *G01N 23/2257* (2013.01); *H01J 37/28* (2013.01); *H01J 37/3002* (2013.01)

(58) Field of Classification Search
CPC ........ H01J 37/00; H01J 37/02; H01J 37/3002; H01J 37/28; H01J 37/08; H01J 37/26; H01J 37/304; G01N 23/2257
(Continued)

(56) References Cited

U.S. PATENT DOCUMENTS

2004/0084620 A1* 5/2004 Khursheed ............ H01J 37/141
250/310
2005/0067567 A1 3/2005 Fukuyama et al.
(Continued)

FOREIGN PATENT DOCUMENTS

EP    0398335 A2    11/1990
JP    03257751 A    11/1991
(Continued)

OTHER PUBLICATIONS

Steffen Jankuhn, "Praktikumsanleitung Ionenstrahlen", Dec. 2015, XP055609873, pp. 1-45.
(Continued)

*Primary Examiner* — Jason L McCormack
(74) *Attorney, Agent, or Firm* — Leydig, Voit & Mayer, Ltd.

(57) ABSTRACT

A device for an MeV-based ion beam analysis of a sample includes a vacuum measurement chamber, having at least one detector and a sample observation unit, a vacuum system for generating a vacuum within the vacuum measurement chamber, and an ion beam tube and a focusing system for focusing an ion beam. The device further includes a sample transfer system, comprising a sample manipulator including a sample holder for receiving at least one sample. The device additionally includes an in-coupling
(Continued)

system for the vacuum-tight connection of the ion beam tube to the measurement chamber, which comprises an ion beam vacuum feedthrough, at least one receiver for a detector, a receiver for receiving the sample observation unit, and a receiver for receiving the sample transfer system. The in-coupling system represents a direct mechanical connection between the components that are the ion lens system, detector and sample observation unit.

20 Claims, 6 Drawing Sheets

(58) Field of Classification Search
USPC .................. 250/306, 307, 310, 492.1, 492.21
See application file for complete search history.

(56) References Cited

U.S. PATENT DOCUMENTS

| | | | | |
|---|---|---|---|---|
| 2005/0274910 | A1* | 12/2005 | Desai | H01J 37/02 250/492.21 |
| 2009/0179161 | A1* | 7/2009 | Ward | B82Y 10/00 250/492.21 |
| 2010/0038538 | A1* | 2/2010 | Drexel | H01J 37/145 250/311 |
| 2011/0147609 | A1* | 6/2011 | Shichi | H01J 27/022 250/400 |
| 2011/0253905 | A1* | 10/2011 | Moebus | G21K 7/00 250/441.11 |

FOREIGN PATENT DOCUMENTS

| | | |
|---|---|---|
| JP | 0587710 A | 4/1993 |
| JP | 07288094 A | 10/1995 |
| JP | 09210927 A | 8/1997 |
| JP | 10256328 A | 9/1998 |

OTHER PUBLICATIONS

D. Hanf, et al., „A new particle-induced X-ray emission set-up for laterally resolved analysis over wide areas, Nuclear Instruments and Methods in Physics Research B 377, Apr. 9, 2016, pp. 17-24.

Daniel Spemann, "Anwendungen hochenergetischer Ionenstrahlen in den Materialwissenschaften: quantitative Ionenstrahlanalyse von optoelektronischen Halbleitermaterialien und Graphit sowie Erzeugung magnetischer Ordnung in Kohlenstoff mittels Ionenbeschluss", Jun. 18, 2007, pp. 1-233.

M. Le Guillou, et al., "Thermal behavior of deuterium implanted into nuclear graphite studied by NRA", Nuclear Instruments and Methods in Physics Research B 332, Mar. 14, 2014, pp. 90-94.

"Piezoelectric Actuators", Produktkatalog, Sep. 2016, pp. 3-74.

* cited by examiner

MEV-BASED ION BEAM ANALYSIS APPARATUS

CROSS REFERENCE TO RELATED APPLICATIONS

This application is a U.S. National Phase Application under 35 U.S.C. § 371 of International Application No. PCT/DE2019/000083, filed on Mar. 27, 2019, and claims benefit to German Patent Application No. DE 10 2018 004 020.9, filed on May 18, 2018. The International Application was published in German on Nov. 21, 2019 as WO 2019/219103 A1 under PCT Article 21(2).

FIELD

The invention relates to the field of material analytics via ion beam microscopy, and in particular, for the quantitative and local analysis of the composition of samples.

BACKGROUND

Numerous analytical methods for determining the compositions of a material sample are known from the literature. In particular, ion beam analysis is suitable for qualitative and quantitative analyses.

Ion beam analysis (IBA) encompasses a multitude of methods that employ different particle beams with energies in the order of several MeV to examine and analyze individual concentrations of a material composition in the vicinity, i.e., in a depth range of approximately 10 µm, a sample surface. In most cases, the method does not operate destructively and does not require any references. By way of this method, depth profiles of elements or isotopes are obtained, as absolute quantities or also as concentration information, when combined with computer-based interpretations. Ion beam analysis, together with scanning methods, furthermore enables a resolution with µm precision for compositional (element- and isotope-resolved) tomographies. For this reason, the applications of ion beam analysis cover a wide range from painting, through thin-film techniques, to material development, wherein each application has its own particular requirements with regard the design of the analysis.

Due the adverse effects of the atmosphere on ion beams, the examinations are generally carried out in a vacuum chamber. The examinations are based on the detection of those products which are generated by the mutual interaction of the sample to be examined with the ion beam. These may be secondary electrons, γ-rays, x-rays, scattered projectiles or products from a nuclear reaction. Various techniques are available for utilizing the information contained in such products. By combining different products detected in parallel, it is advantageously possible to achieve unambiguous results[1]

Nuclear reaction analysis (NRA), Rutherford backscattering spectrometry (RBS) and particle-induced X-ray emission (PIXE), also referred to as total IBA[2], also represent a suitable combination of analytical tools that allow particularly low ambiguity and uncomplicated integration.

For example, particle-induced X-ray emission or proton-induced X-ray emission (PIXE) is a commonly used method in ion beam analytics. During PIXE, the sample is examined with an ion beam. When passing through the sample, the ions lose energy, mainly due to interaction with the electron shell of the target particles. In the process, there are also impacts between the particles and inner-shell electrons. These are thereby knocked out of the atomic shell and, consequently, the nucleus can be de-excited by characteristic X-ray radiation. This is used during PIXE to determine the element concentration. The method itself is particularly suitable for heavy elements (atomic numbers Z>12 to 20) and has a significantly lower bremsstrahlung background in comparison with other X-ray methods. It is thus also possible to analyze trace elements.

Nuclear reaction analysis (NRA) is also used to examine material compositions. During NRA, the sample is bombarded with an ion beam usually having an energy in the range of 100 keV up to several 10 MeV. For material analysis, nuclear reactions are used, which arise as a result of the interaction between the particle beam and the sample atoms and emit the α, proton and/or γ radiation. Corresponding to the reaction, the radiation has a certain sharply defined energy in each case. If the ion beam used has been selected to match the isotope to be detected, the concentrations of individual isotopes of the surface layer of a sample can advantageously be measured.

The NRA is suitable for examining the surface of samples. The analyzable depth increases with the beam energy and decreases with the atomic number of the ions. It also depends to a lesser degree on the sample composition. In general, it is a few micrometers. Since, in general, only one element or a few elements can be measured with a certain beam energy and ion species, additional analyses using other methods are generally necessary in order to completely characterize the sample.

Due to its isotopic selectivity, the method is particularly suitable for detecting trace elements, but also for analyzing processes by means of certain tracer isotopes. It is used above all for the detection of light elements such as hydrogen or lithium.

Rutherford backscattering spectrometry (RBS) is also a method for examining thin layers close to the surface with the aid of ion beams. For a measurement, high-energy ions (0.1 to 4 MeV) of low mass (hydrogen or helium) are made to impinge on a sample. A detector measures the energy of the backscattered ions. Their energy depends on the original amount of energy, on the mass of the respective struck sample atom and on the angle under which it is detected. Due to the depth dependence of the energy of the backscattered particles, the measurement of the composition of a sample by means of RBS is also depth-resolved, wherein depths from several hundred nanometers up to a few micrometers can be examined, depending on the test parameters.

Examining the material composition of a sample by means of ion beam analysis (IBA) has therefore already become a standard method. In this respect, the combination of PIXE, NRA and RBS examinations already leads to an almost complete analysis of all elements of the periodic table using only one measurement.

Such a combination shows, for example, a detection limit in the ppm range, and an accuracy in the sub-% range for light (NRA), medium heavy (PIXE) and heavy (PIXE+RBS) elements in a consistent manner, which is particularly advantageous compared to conventional electron beam analytics. Such advantages are of particular interest for material research, where elements of the entire periodic table frequently occur in a sample in drastically varying concentrations.

In many ion beam microscopes, the so-called "beam scanning" technique is used for measuring the sample surface, but this allows a less precise spatial calibration than a displacement of the sample using a constant ion beam. The term "beam scanning" is generally understood to mean the scanning of the beam position on the sample by electromagnetic deflection.

The lateral resolution during the ion beam analysis is defined by the ion beam cross section on the surface of the sample (spot size). Ion beams, with which proton or helium ions of 1 to 10 MeV are typically used, allow the focusing of the ion beam via quadrupole magnets, which are generated with an nA current in modern accelerators, in the order of magnitude of 1 µm. At this size, the combination of technical issues, related to vibrations, sample scans, pumping, sample observation and stray magnetic field, with the detector requirements and precise alignment presents a challenge in terms of instruments.

The MeV ion-based measurement of samples thus represents an important alternative measuring technique for electron microscopy, which has a multitude of improvements in the measurement properties and in addition a sensitivity for the properties of the atomic nuclei within the sample. The technique has been in use in science for many years. However, to date it has not been able to attain the same commercial relevance as electron microscopy due to the existing complex design and high specific costs.

SUMMARY

In an embodiment, the present invention provides a device for an MeV-based ion beam analysis of a sample. The device includes a vacuum measurement chamber, having at least one detector and a sample observation unit, a vacuum system for generating a vacuum within the vacuum measurement chamber, and an ion beam tube and a focusing system for focusing an ion beam. The device further includes a sample transfer system, comprising a sample manipulator including a sample holder for receiving at least one sample. The device additionally includes an in-coupling system for the vacuum-tight connection of the ion beam tube to the measurement chamber, which comprises an ion beam vacuum feedthrough, at least one receiver for a detector, a receiver for receiving the sample observation unit, and a receiver for receiving the sample transfer system. The in-coupling system represents a direct mechanical connection between the components that are the ion lens system, detector and sample observation unit, thus enabling small distances and a precise alignment between the last ion-optical component of the focusing system, the sample to be examined and the detector.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

The present disclosure provides a device for ion beam analysis which, compared to the existing prior art, allows a more precise and improved local resolution. The present disclosure provides for improving the handling, productivity and costs of the existing technology of MeV ion beam analysis, and in particular of MeV ion beam microtomography. Particular attention should be paid to increasing the sample throughput and the measuring speed, and reducing the measurement preparation complexity, while achieving at least the same measuring quality.

The present disclosure further provides a method for operating such an improved device.

A novel device according to the present disclosure for carrying out ion beam examinations advantageously allows a more precise and improved local resolution over the existing prior art. The device according to the present disclosure can thus advantageously improve the existing technology of MeV ion beam microtomography in terms of its handling and productivity. and in terms of costs.

The technical challenge results from the desire to preferably maintain the measuring accuracy, the measuring properties, and the reproducibility not only at the present state of the art, but also to improve it, if necessary. For good measuring properties and high spatial resolution, it is very important in particular to minimize the distances between the sample and the detector and the ion focus lens.

In addition, the properties of a sample to be analyzed are decisively influenced by the properties of the ion beam used. Thus, a very intense ion beam having a very small spot diameter is required in order to generate good counting statistics for accuracy or precision with high spatial resolution. These two opposing objectives can be reconciled or resolved by ion beam focusing.

The device according to the present disclosure combines existing technology with specially adapted and newly created technology. The device for carrying out ion beam examinations in detail comprises a vacuum measurement chamber, including at least one detector and a sample observation unit, a connection of the vacuum measurement chamber to a vacuum system, a beam tube and a focusing system for focusing the ion beam, and a lock for receiving a sample transfer system, along with a sample holder for one or more samples, which is advantageously arranged on a sample manipulator.

Figure 1:
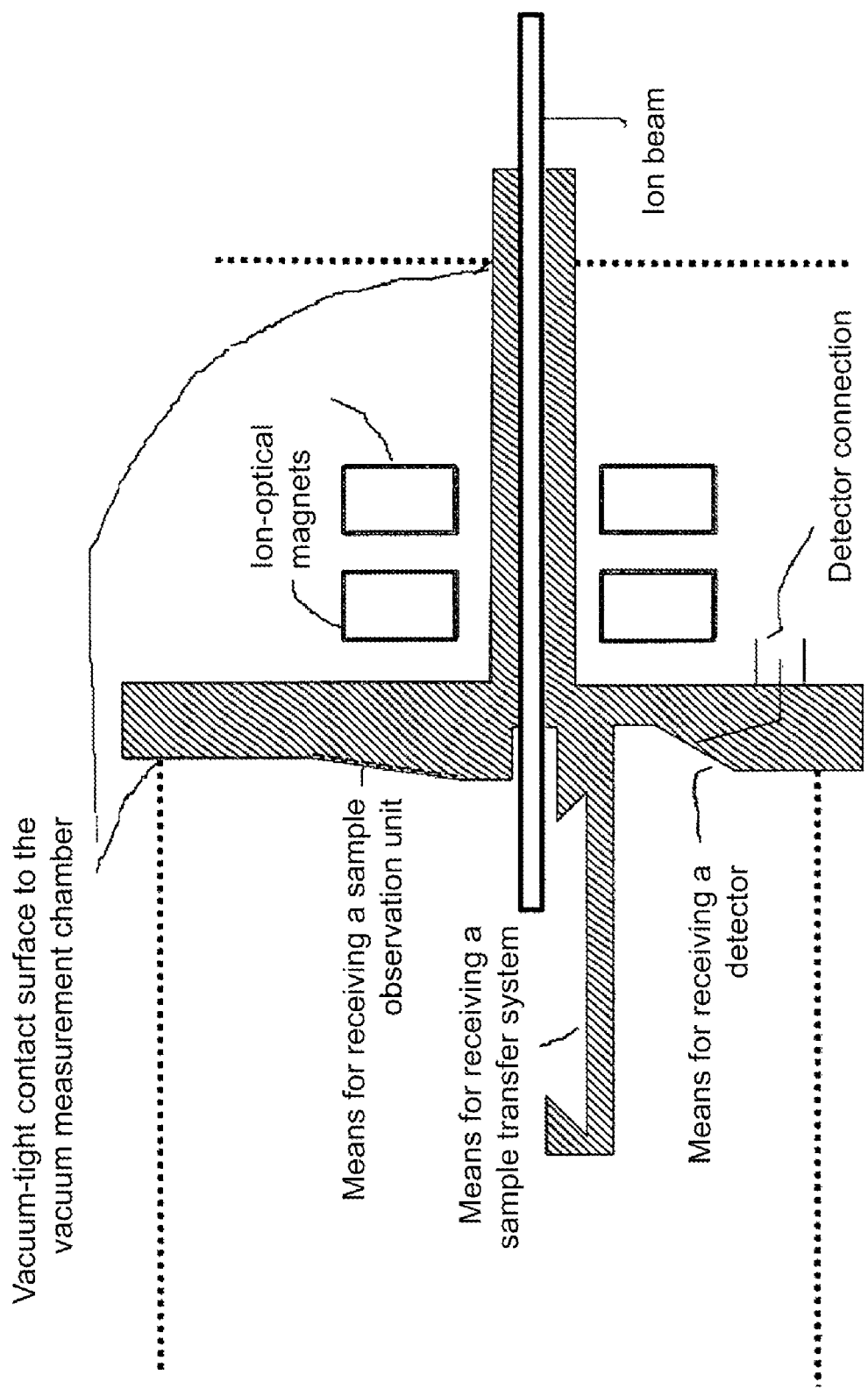
FIG. 1 is a schematic representation of an embodiment of an in-coupling system.

The device comprises an in-coupling system for the vacuum-tight connection of the ion beam tube to the vacuum measurement chamber, which, on the one hand, comprises the ion beam feedthrough, but at the same time also provides at least one means for receiving the at least one detector. In addition, the in-coupling system comprises a means for receiving a sample observation unit, and a means for receiving a sample transfer system. FIG. 1 schematically shows such an in-coupling system.

The in-coupling system enables a direct—and preferably one-piece—mechanical connection between the active components, these being ion lens system, detector, sample observation unit, and sample transfer system. The compact in-coupling system advantageously makes smaller distances possible between the active components than was previously possible with the known devices, and thus a reproducible and precise alignment between the aforementioned active components.

The device for carrying out ion beam examinations comprises, as a core idea of the disclosure, a preferably one-piece in-coupling system which allows the focused ion beam to be coupled into the vacuum measurement chamber onto a sample, and, for this purpose, at the same time also the sample transfer system, encompassing sample observation and detection. The in-coupling system thus enables a direct connection of these active components and a vacuum-tight connection to the remainder of the system.

The in-coupling system for the vacuum-tight connection of the ion beam tube to the measurement chamber comprises, in addition to a vacuum ion beam feedthrough, at least one means for receiving a detector, a means for receiving a sample observation unit along with a means for receiving a sample transfer system, and advantageously enables particularly small distances and a precise alignment between the last ion-optical component of the focusing system, the sample to be examined and the detector.

In the simplest case, the means for receiving a sample observation unit can be a flat surface that is suitable for arranging and fixing an observation mirror thereon, for example.

However, the means for receiving a sample observation unit can also be a mount for receiving a high-resolution camera, for example.

Likewise, the means for receiving a detector can simply be a mount to which a detector can be connected and fixed.

The means for receiving a sample transfer system can, for example, be a rail on which a sample transfer system can be easily arranged.

Further particularly advantageous embodiments moreover describe an optimized vacuum system, an optimized focusing system and an optimized sample transfer system, which each individually, or also in any desired combinations, achieve a further marked improvement of the existing analytical systems and of the analytical systems.

The vacuum measurement chamber and the beamline with the focusing system are typically arranged on a vibration-decoupled table.

The vacuum measurement chamber comprises a connection to a vacuum system. The vacuum system is used to generate a negative pressure in the measurement chamber. For example, pressures in the range of $10^{-3}$ to $10^{-7}$ pa are required for MeV ion beam microtomography, wherein a pressure < of $10^{-5}$ Pa is sought for optimal measurement properties. In this process, the sample replacement and the evacuation time required thereafter have to be taken into account, with their influence on the productivity or measurement readiness of the system, when it comes to the design of the vacuum system.

The use of non-magnetic vacuum components and adapted distances between the vacuum technology and the sample position is proposed in order to reduce stray electromagnetic fields. Thus, special stainless steels, aluminum, copper, plastics and other special alloys can preferably be used as non-magnetic materials. Heat-resistant, non-magnetic materials such as tantalum and tungsten can be used in particular for ion beam diaphragms. According to the disclosure, the relative thermal expansion of all components must be taken into account with temperature fluctuations in order to obtain the relative alignment of the ion beam, detectors and sample within the scope of the spatial resolution of the measurement.

In addition, vibration decoupling can be achieved by elastic vacuum components and mounts, wherein the influence of these components on the vacuum properties must be taken into consideration. Conventional magnetically mounted turbomolecular pumps can advantageously be used. The use of three-phase motorized backing pumps is also advantageous.

The vacuum measurement chamber additionally includes a lock for receiving a sample transfer system. This can be a window flange, for example, or a vacuum transfer lock with a mechanical feedthrough.

In addition to the previously known sample holders for one or more samples, a particularly adapted form of a sample transfer system can also be used according to the disclosure. This initially comprises a sample holder, which can be mounted without tools directly on at least one sample manipulator.

In a particular embodiment of the disclosure, the vacuum measurement chamber can support different types of sample manipulators, for example with different axes, by means of a suitable means for receiving a sample transfer system, wherein these can all use the same sample holder or different sample holders.

In particular, time for changing a sample holder can be saved by the tool-less and thus faster mounting of the sample holder.

According to the present disclosure, the tool-free replacement of the sample holder can take place both under vacuum or also in air through a window flange.

The device offers particular advantages, in particular for a replacement or for mounting under vacuum, since here a sample change can be carried out without venting and evacuating the measurement chamber.

In particular, a sample holder on an existing sample manipulator can be replaced with a new sample holder. However, it is also conceivable that the entire sample transfer system, together with a sample holder and, if necessary, a sample manipulator, is transferred out of and into the measurement chamber for a sample change. The latter is advantageous, for example, for samples having drastically different weights, where different sample manipulators are required in each case.

The sample holder is preferably suitable for receiving a plurality of samples (multiple-sample holder). The more samples can be arranged on a sample holder, the less time is required for sample transfers out of and into the measuring cell. This likewise typically results in an increase in the measuring capacity or productivity.

The sample holder is designed such that it can be arranged and fixed in an electrically insulated manner from a sample manipulator and the vacuum chamber on a sample manipulator.

The sample holder can thus be set to a defined voltage relative thereto (to the sample manipulator and the vacuum chamber) in order to suppress the secondary electrons occurring during ion beam measurement over a maximum solid angle range. The applied voltage can preferably be varied for the secondary electron imaging.

The sample manipulator itself comprises a non-magnetic material and is preferably configured as a multi-axis sample manipulator. The motor is advantageously piezoelectric, comprising integrated path/position sensors. With the aid of the sample manipulator, the sample is, or the samples are, exactly positioned on the sample holder with respect to the focused ion beam. This makes it possible to scan the sample. In the process, scanning is understood to mean the lateral measurement of the sample surface by displacing the sample and recording of the measurement signals at fixed points (predefined grid) or during a predefined movement (scanning) using an ion beam that is always stationary.

As a result of the displacement of the sample manipulator or a contact, it is possible to contact the sample mechanically and/or electrically in the region of the measuring spot of the ion beam, in order to supplement the ion beam measurement with corresponding measurement techniques or sample-varying techniques.

For example, a wire can be arranged at the coupling element, by means of which a battery can be contacted, and thus the ion beam measurement can be analyzed during the charging/discharging processes. However, a heating element or a penetrator is also conceivable. This technical extension makes it possible to turn this method into an in-situ analysis.

In order to enable the correct alignment of the sample, ion beam, and detectors with respect to one another, the measurement chamber can preferably be aligned in translation and rotation with respect to the ion beam using several stages of increasingly finer adjustment screws and laser reflection.

The positioning technique is "calibration-free" in the process, which means that, during an installation or a variation of the measurement settings, for example of the ion beam energy or type, advantageously no renewed spatial calibration is required, because the positioning technology provides the location information and is always the same.

The in-coupling system comprises a means for receiving a sample observation unit. In the simplest case, this means can be a flat surface on which an observation mirror is arranged.

However, the means is preferably also suitable for receiving a more complex sample observation device. It comprises at least one camera, which preferably includes a high-resolution telecentric lens, and at least one deflection mirror by means of which the sample can be observed from the view of the ion beam. This is particularly advantageous in the case where the measurement chamber supports different types of sample manipulators, for example with different axes, but which all use the same sample holder.

The optical resolutions in the micrometer range possible according to the prior art allow the sample to be rapidly position with respect to the ion beam. Telecentric observation makes it possible for the user to accurately define measuring grids, regardless of sample geometry and alignment or measuring angle. To correct the distance between the sample and the detector, in particular in the case of different sample thicknesses, the depth of field of the camera observation or another optical or mechanical distance measuring method can be used.

The vacuum measurement chamber can be used in particular together with an ion beam source with ion-optical focusing. Conventional ion beam sources and accelerators are suitable as ion beam sources, in which typically protons, deuterons or helium ions having an energy in the range of 100 keV up to several 10 MeV are used. The ions are transported by the accelerator via the ion beam tube under vacuum into the measurement chamber.

The focusing of the ion beam necessary for ion beam microtomography within the meaning of the invention can take place, for example, via quadrupole magnets, such as are already used on modern accelerators. The plane or the point in which the focusing of the ion beam takes place, and in which thus the smallest beam diameter is present, is also called the ion beam focus.

However, a core of the disclosure is the in-coupling system. This advantageously enables the optimized shortened distances between the ion focus lens of the sample (ion beam focus plane) and at least one detector, which subsequently lead to a significant improvement in the measurement results or the spatial resolution.

The in-coupling system can be a ion beam vacuum tube feedthrough, which at the same time also comprises at least one means for receiving a detector, a means for receiving a sample observation unit along with a means for receiving a sample transfer system.

The in-coupling system is designed to be compact, preferably even in one-piece. It is preferably made of non-magnetic stainless steel.

The in-coupling system can preferably be present in the form of an articulated vacuum feedthrough.

In a particular embodiment, the in-coupling system can comprise a two-stage articulated joint with lateral and transverse flexibility.

Figure 2:
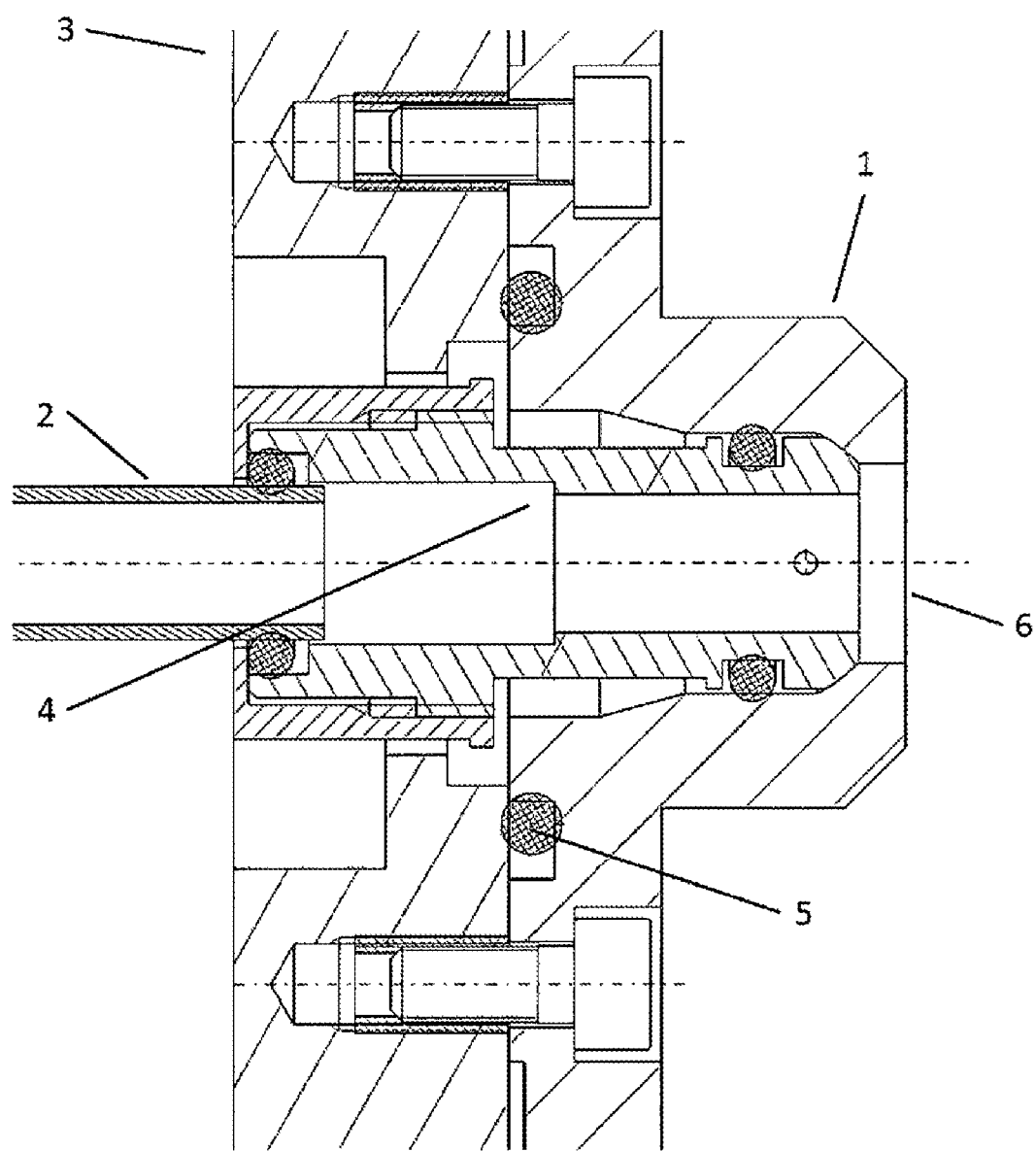
FIG. 2 details an advantageous embodiment of an in-coupling system.

FIG. 2 shows a detail of a particularly advantageous embodiment of the in-coupling system (here without the means for receiving a detector, without the means for receiving a sample observation unit and without the means for receiving a sample transfer system), which relates in particular to the region of the ion beam vacuum tube feedthrough.

The in-coupling system comprises a means for receiving a detector. The at least one detector is suitable for detecting at least one type of particle, e.g. photons or ions. It is also advantageously possible to use a detector which is capable of detecting several types of particles. Advantageously, at least one detector can comprise a diaphragm which hides certain particle types, energies or scattering angles.

Furthermore, it is also advantageously possible for multiple detectors for one or more particle types to be arranged in the in-coupling system. Further detectors can also be present at the measuring structure independently of the in-coupling system.

In addition to the at least one detector, a further sample observation device, for example in the form of a (deflection) mirror and a camera comprising a high-resolution, telecentric lens, can preferably also be arranged at the in-coupling system.

An ion beam diaphragm can optionally also be attached to the in-coupling system.

By using the in-coupling system, separate detector holders, vacuum components and other attachments can be saved. The number of components located between the detector, sample and ion focus lens and the dimensions thereof, thus decrease, whereby the distances can be reduced. The accurate relative alignment of these three central elements, and thus the measuring accuracy, becomes more difficult, in terms of technology, at lower distances, and an integrated or one-piece design shifts this technical challenge from assembly to manufacture, so that significantly lower tolerances can be achieved.

The device or the in-coupling system preferably comprises a means for correcting distance between the sample surface and the detector in the installed state, in order to, for example, ensure a constant distance between the measuring point and detector, for example in the case of samples of differing thicknesses or curved samples. Such a means relates this variable distance to another distance that has a fixed relationship with respect the detector. Advantageously, the depth of field of the observation camera or also another optical or mechanical method could be employed in the process.

In one of its advantageous embodiments, the entire provides the solution to the technical problems relating to vibrations, sample scans, pumping, sample observation and the stray magnetic field with respect to the requirements of the detectors and the precise alignment, which regularly represent a challenge, in terms of instruments, of this measurement technique. Particular attention was paid to increasing the sample throughput and the measuring speed, and to reducing the measurement preparation complexity.

In summary, the advantages of the device for the MeV ion beam microtomography can be summarized as follows:
- adjustability of the detector, sample and ion focus lens to <0.1 mm, and an alignability < to 0.5° by way of multistage adjustment screws and special in-coupling system, increased sample throughput through the use of a calibration-free in-vacuum sample manipulator with quick-change device, high-resolution telecentric camera observation and high vacuum suction power, with simultaneously low vibration in-coupling into the measurement chamber;
- nanometer positioning accuracy and reproducibility by in-vacuum piezoelectric sample manipulator (as an alternative to the beam scanning technique), selection and arrangement of the materials and components to compensate for thermal expansion during long measuring times, reduction of the sample vibrations;
- negligible stray magnetic fields as a result of material selection on chamber and sample manipulator, measuring instrument selection and optimization of the distances from instrument to sample;
- sub-% measuring accuracy and ppm detection limits as a result of optimization of distance between detector and sample for optimal counting rates, with simultaneously high energy resolution (circular segment detector diaphragms) combination of three measuring techniques (NRA, RBS, PIXE) in narrow space, secondary electron suppression with full space coverage for accurate ion current measurement;
- increase in the magnetic focusing for spatial resolutions in the μm range as a result of reduced distance between magnet and sample by means of the in-coupling system, with e.g. integrated detector holders, in-vacuum sample manipulator (instead of beam scanning) and external telecentric camera observation via a deflection mirror;
- in-vacuum contacting of samples, telecentric observation and sample manipulator for in-situ measurement of active processes; and
- optization of the parameter space, minimal detector-magnet-sample distance (small ion beam diameter), small relative tolerances (accuracy) and space for detectors and electrical contacting.

The subject matter of the present disclosure is explained in more detail in the following based on a specific exemplary embodiment of an MeV-based ion beam analysis system, without this limiting the broad scope of protection. The optimized individual parts of the system described hereafter can be used individually or also in any combination with the in-coupling system.

Within the scope of the present disclosure, a new design for the MeV ion-based ion beam analysis with spatial resolutions between 10 and 1000 nm was developed and presented. The setup combines state-of-the-art industrial products to form a reliable device with simple handling, high precision and a throughput of >40 samples per day. The design is composed of four independent parts, these being the vacuum system, the magnetic focusing of the ion beam, the sample observation and positioning along with the detectors for ion beam analysis. Particular attention was paid to maintaining a vacuum of approximately $10^{-7}$ mbar, without stray fields or significant vibrations entering the sample chamber.

In the sample chamber, a combination of a fixed beam axis with a piezoelectric precision sample manipulator, with a precision in the range of a few nanometers and a high-resolution telecentric camera proved to be reliable and practical for sample positioning. Three charged particle and X-ray detectors were installed with specific apertures and stop films to allow a total IBA analysis with high depth resolution, accuracy in the sub-% range and a detection limit in the ppm range.

The installation and adjustment of the device was a particular challenge, since an accuracy of <0.1 mm< and 0.5° is required for aligning the various parts in order to achieve the desired measuring accuracy of <1%. Multiple stages with planes, leveling cameras, lasers and adjusting screws with two accuracy levels in several locations led to a successful alignment. The last step required the alignment of the magnets to a few μm about the beam axis by direct ion beam observation and made it possible to achieve the specified reduction of approximately 24. The use of a test pattern on scintillation glass enabled the determination of the beam position and diameter.

Figure 3:
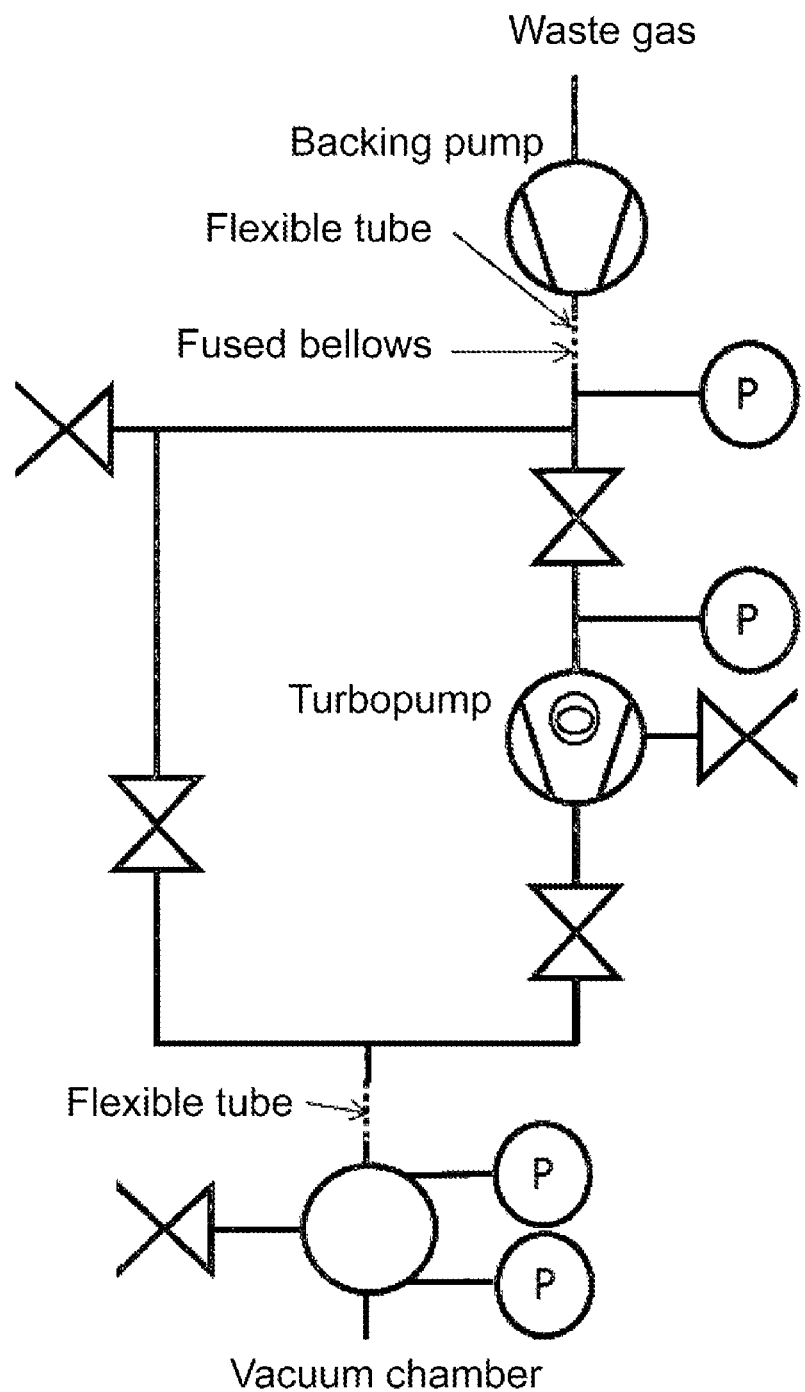
FIG. 3 is a schematic representation of an advantageous pump system.

In addition, several figures are provided, which further illustrate the device according to the present disclosure. The following are shown:

FIG. 1: Schematic representation of an embodiment of the in-coupling system, comprising an ion beam vacuum feedthrough, a means for receiving a sample observation unit, e.g., a mirror, a means for receiving a detector along with a means for receiving a sample transfer system (here a mounting rail);

FIG. 2: Detail of an advantageous embodiment of the in-coupling system. The ion focus lens adjoins on the left, and the sample holder on the right. The exemplary embodiment uses a double joint including O-ring seals for mechanical decoupling. 1=in-coupling system, 2=ion beam tube, 3=vacuum measurement chamber, 4=2-axis vacuum joint, 5=O-ring seal, 6=inner side of the measurement chamber;

FIG. 3: Schematic representation of an advantageous pump system. The required pump system must allow rapid evacuation and working that is as vibration-free as possible. For this purpose, a bypass is provided so that a turbopump can run continuously. The use of low-stiffness vacuum components also preferably reduces a transfer of vibrations. For rapid evacuation, the bypass is used as a rotary vane pump in order to achieve pressures of less than 0.1 mbar. The bypass can then be closed in order to achieve a vacuum of up to $5*10^{-3}$ mbar.

Figure 4:
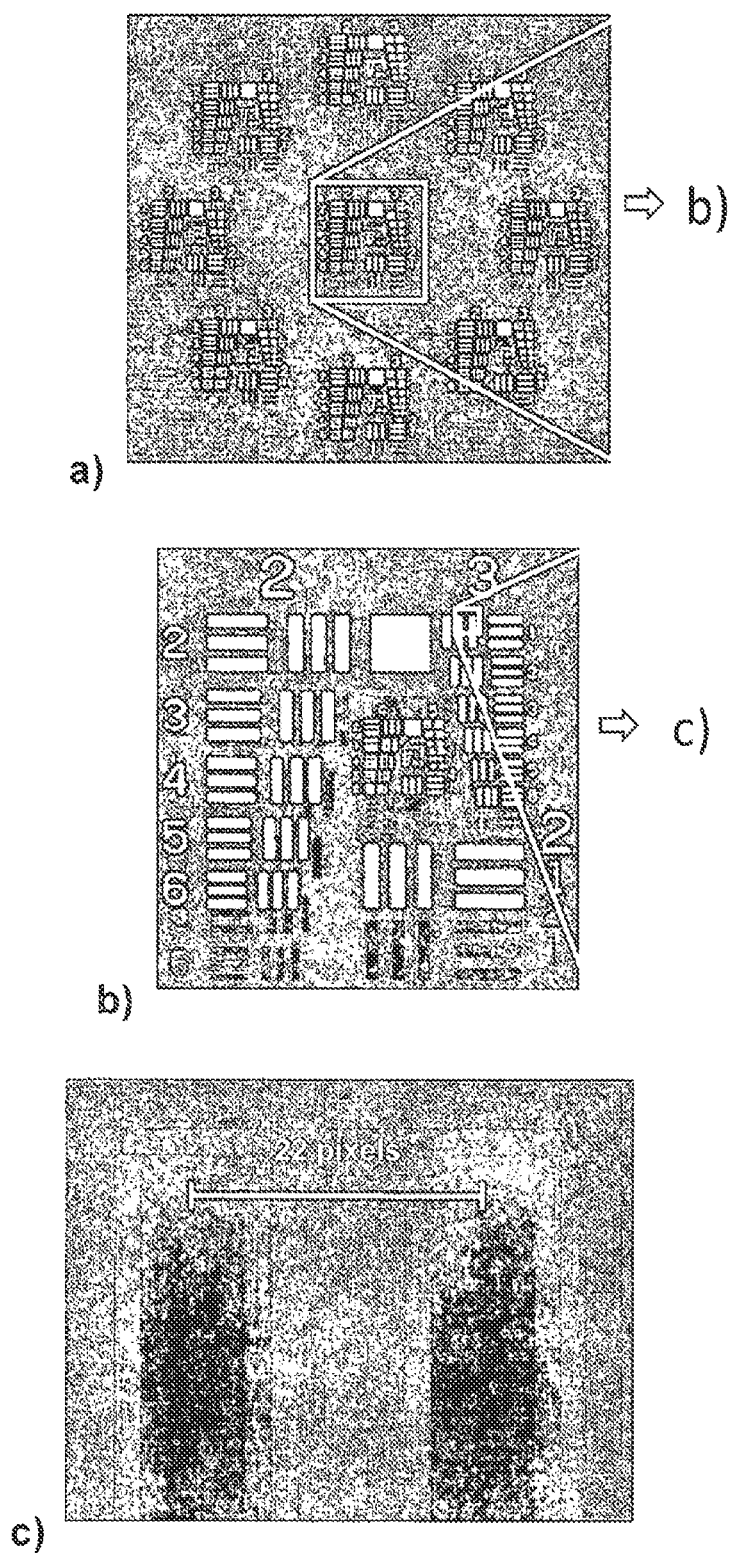
FIG. 4(a) shows a 1"×3" positive, USAF 1951 wheel target with chromium lines on scintillating float glass.
FIG. 4(b) shows a magnification of FIG. 4(a)
FIG. 4(c) shows a magnification of FIG. 4(b)

FIG. 4:
a) 1"×3" positive, USAF 1951 Wheel target with chromium lines on scintillating float glass. Each block contains a series of triplicate lines of decreasing size. The line spacings and line widths of each triplet are known, since the smallest resolvable line triplet supplies the resolution of the camera or ion beam.
b) Magnification of a).
c) Magnification of b). The image shows a line pair with a center-to-center distance of 22 pixels. According to the specifications, there are eight pairs of lines per mm on this triplet. A line pair therefore has a distance of 0.125 mm, and the pixels are calibrated to a spatial width of 5.68 µm.

Figure 5:
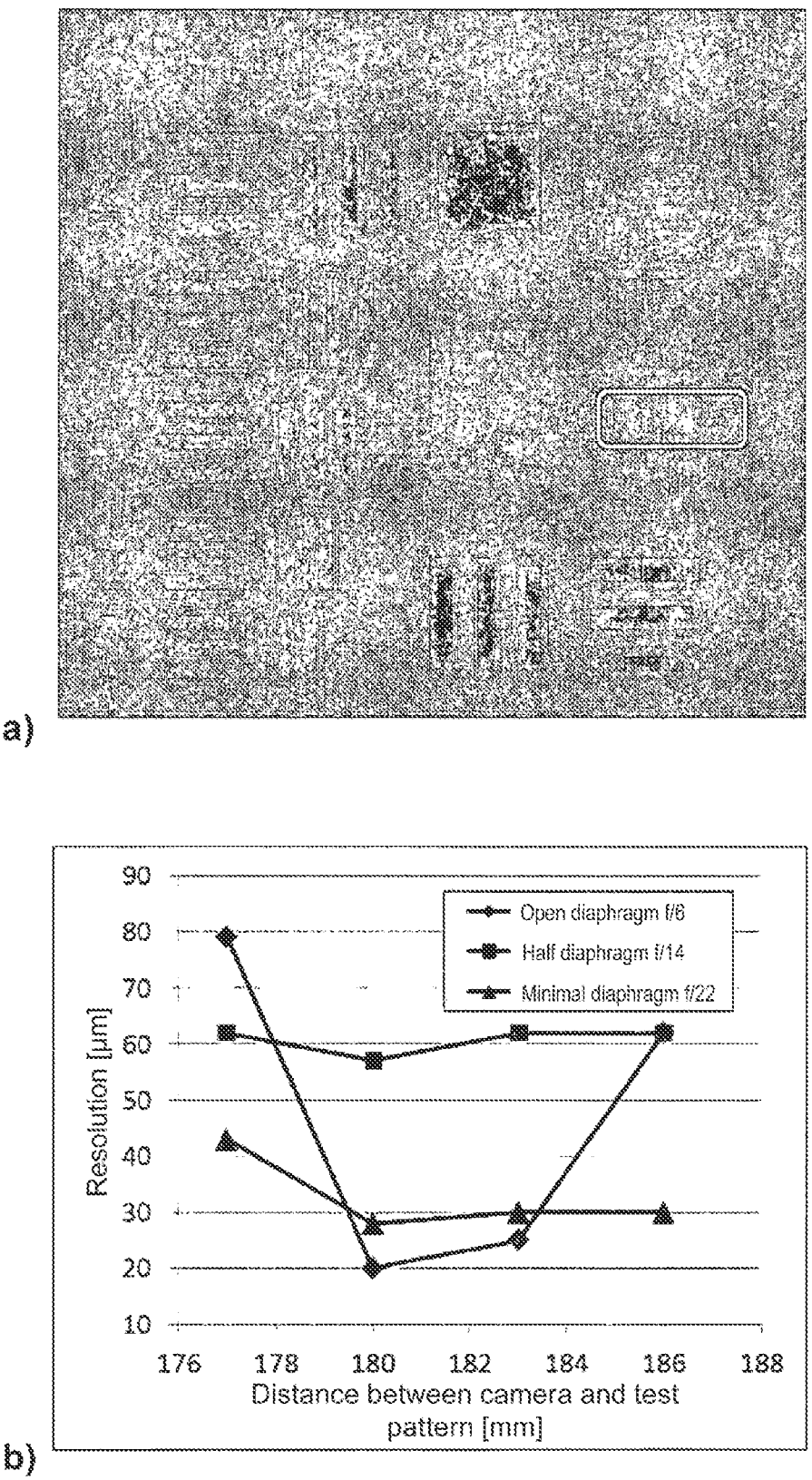
FIG. 5(a) shows a detail of the USAF 1951 test pattern with f/6 diaphragm.
FIG. 5(b) shows resolution with respect to diaphragm and working distance.

FIG. 5:
- a) Detail of the USAF 1951 test pattern with f/6 diaphragm. In the best case, the lines of the fifth element of the fifth group (box) can be separated, yielding a spatial resolution of 19.7 µm.
- b) Resolution with respect to diaphragm and working distance.

Figure 6:
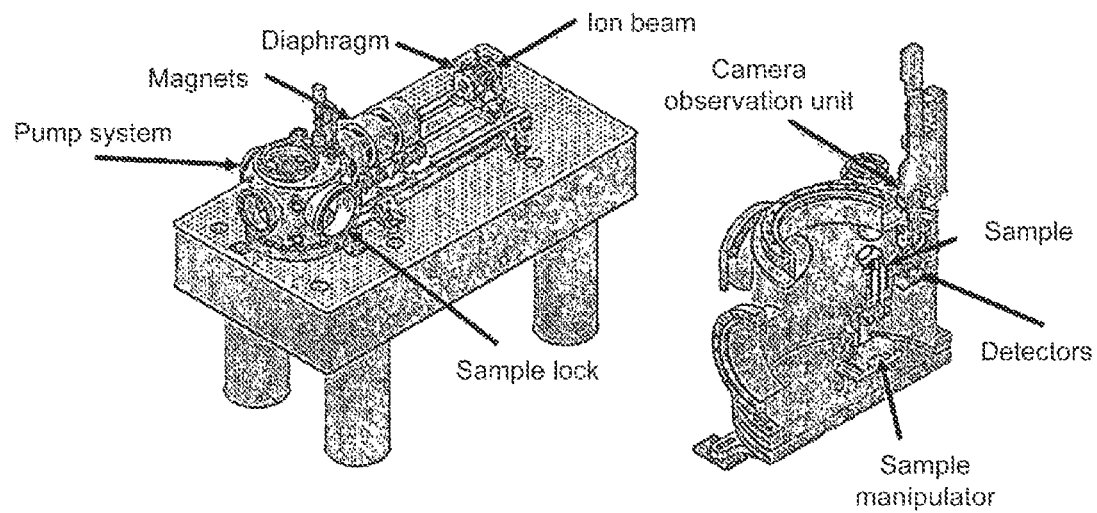
FIG. 6 is a schematic representation of an embodiment of a MeV analysis system according to the invention.

FIG. 6: Schematic representation of an embodiment of a MeV analysis system with in-coupling system. Left: The µNRA setup together with the focusing magnets on the vibration-damping table. Right: Section of the vacuum chamber with in-coupling system, with sample manipulator arranged thereon, including sample, sample observation unit and detector.

Figure 7:
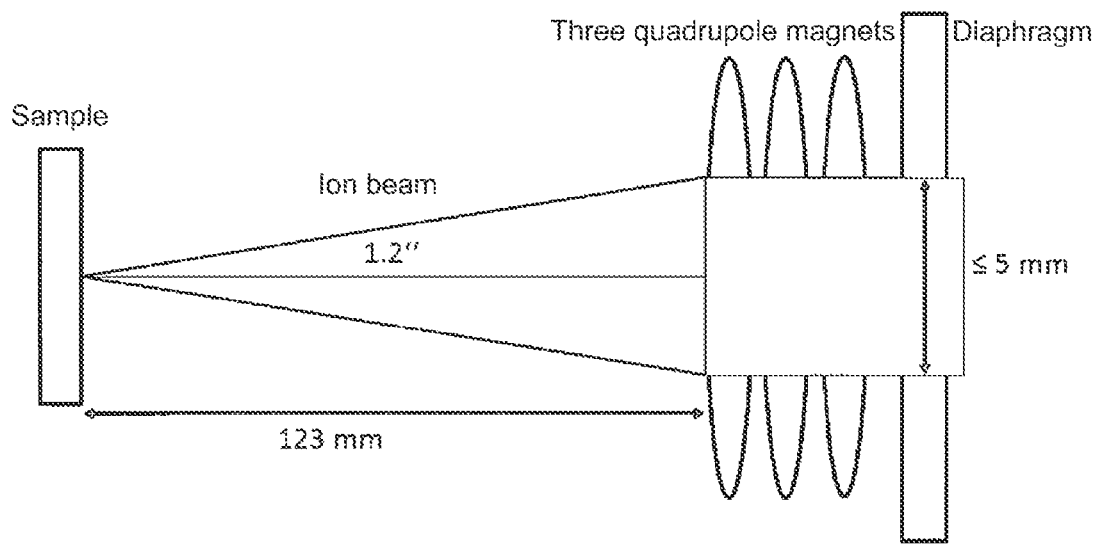
FIG. 7 illustrates a sketch of the focusing setup.

FIG. 7: Sketch of the focusing setup. The ion beam comes from the right side. The object/diaphragm aperture defines its size. Three quadrupole magnets focus the beam onto the movable sample.

A technical design of an inventive embodiment combines a triple quadrupole focusing magnet, a UHV measurement chamber, a vibration-insulated table and the detector structure. The magnets induce a field strength of up to 0.4 T along the optical axis. They can be aligned with an accuracy of 1 µm. The beam current is specified to 0.6 nA by the manufacturer of the magnets for a spot size of 1 µm, at a distance of 160 mm between the last magnet and the sample. For good detection limits of light elements with a depth resolution of approximately 100 nm, a few 100 Pa define a practical limit. The ion beam part can thus supply the required beam characteristics.

The design of a technical structure in this precision range, in combination with the option of frequent sample replacement, along with the requirements with regard to a precise angular alignment and low ion-specific doses, as proposed, required the development of a new analysis setup for a MeV ion analysis system, which is described hereafter under the designation µNRA.

The individual components of this technical structure of an advantageous embodiment are described in greater detail. These include:
- a. Pump system and vibration damping
- b. Sample observation
- c. Vacuum measurement chamber and beamline
- d. Magnetic focusing system
- e. Positioning of the samples or of the sample manipulator
- f. Detector system for the ion beam analysis A. Pump System and Vibration Damping The pump system of the vacuum chamber is designed so as to provide a low base pressure of $5\pm2*10^{-8}$ mbar for stable sample surfaces and ion energy losses <<0.1 keV. At the same time, it allows rapid sample replacement and rapid evacuation. The pump system should additionally not induce any stray magnetic fields and vibrations into the measurement chamber. For this purpose, the pump system comprises three parts, which are divided by sliders and elastic elements, as shown in FIG. 2.

These three parts include a backing pump, a turbopump and a µNRA chamber part (=vacuum measurement chamber). Each of these three parts is equipped with a vacuum meter and a vent valve for safe access and easy maintenance. The pump system is installed at a lateral CF100 port of the sample chamber.

The rotary vane backing pump is primarily responsible for the oscillation of the pump system. The turbomolecular pump (Pfeiffer 300M) operates with completely contactlessly operating magnetic bearings, whereby the external vibration amplitude is greatly reduced. Rigid vacuum lines typically result in these vibrations being transferred onto the samples in the analysis chamber. In order to reduce this transfer, low-stiffness vacuum components are installed to reduce the vibration amplitude to below 1 µm.

In order to quantify the success of this approach, the vibration amplitude is measured with a highly-precision LK-H052 laser distance meter from KEYENCE. The path sensor operates with a repetition accuracy of 0.025 µm, a spot diameter of 50 µm and a measuring frequency of 50 kHz (maximum detectable vibration frequency of 25 kHz). The laser is located on a stand next to the low-vibration table. When the laser is positioned at the various points, the distance is recorded in 3 million points for 60 seconds. Amplitudes up to 1.6 µm were able to be detected at different locations of the vacuum system, while the vibrations at the sample position were below the detection limit.

B. Sample Observation

For the sample observation, a color camera FLEA3-FL3-U3-88S2C was combined with a 8.8 Mpixel-1/2.5-inch detector including a 0.28-fold telecentric lens from Techspec and with a working distance of 180 mm. This provides a field of view of approximately 23 mm (½" camera), a depth of field of ±7 mm and a <telecentricity of <0.03°. Due to the telecentricity, the samples are always observed virtually frontally, so that all distances are maintained over the entire field of view, even when the samples are rotated. This makes it possible to find the beam position and size on a scintillator, store this position on the camera image and navigate to non-scintillating samples with accurate knowledge of the distances traveled.

Every time a sample is changed, a position verification with the camera system is required, since mechanical tolerances and changes in the beam optics limit the accuracy of the positioning of samples and ion beam. Although a far-field microscope could have provided a better spatial resolution than the telecentric lens, the solution provides the larger field of view, a higher depth of field, telecentricity, and also significantly lower costs. The camera is first tested outside and later installed on the vacuum measurement chamber. During the installation, the setting screws allow inclination, rotation and range settings by observing samples at the set sample manipulator.

The telecentric camera design is first calibrated in a test stand using a standardized vacuum-compatible test pattern, which is also used for the later beam solution tests. The best spatial resolution is found by verifying the following parameters: angle of incidence, objective aperture, the test pattern position in the field of view of the camera, the test pattern illumination, and the distance between the objective front and test specimen. The distance between two line centers on the test pattern compared to the number of pixels between two lines thereby yields the pixel width calibration, as shown in FIG. 3. On average, a pixel corresponds to 5.71±0.12 µm, compared to nominally 5.5 µm/pixel. A change in the position of the test pattern in the field of view of the camera has no influence on this calibration and thus confirms the telecentricity of the objective.

The spatial resolution is checked with respect to the angle of incidence, the diaphragm opening, the test image position in the camera view field, the test image illumination, and the distance between the camera front and test image (working distance). In addition to the influence on the working distance via the field of view if the observation is not perpendicular, no influence of the observation angle on the spatial resolution is observed, similarly to the spatial calibration. The working distance is varied between 177 mm and 185 mm for the perpendicular observation, with a nominal working distance of 180 mm.

The spatial resolution is determined by checking which elements of the test image of the camera can still be separated with the eye. The best spatial resolution is achieved at full aperture with a maximum of 19.7+0-2.1 µm, at a distance of 180 mm between the camera lens front and the test pattern. Only a negligible deterioration in the resolution occurs between 180 and 183 mm (see FIG. 4).

The manufacturer's information regarding a spatial resolution of 10 µm with a reduced aperture opening is not achieved, probably because the illumination was not sufficient with a closed aperture, and camera noise dominates under poor lighting conditions. Unfortunately, the use in an ion beam analysis chamber prevents more intensive illumination due to possible damage to the photosensitive radiation detectors.

C. Vacuum Measurement Chamber and Beamline

FIG. 5 shows a very advantageous embodiment, designed in CATIA, comprising an optimized vacuum measurement chamber and the beam tube as part of the beamline. The production takes place with tight tolerances at the points at which an influence on measuring angles and distances is relevant, e.g., at the ion beam impingement angle.

The beam guide consists of CF100 316 stainless steel vacuum parts and has a length of sample to switching magnet of approximately 5 m. It is equipped with the same backing and turbo pumps as the vacuum measurement chamber and reaches a base pressure of $1*10^{-8}$ mbar.

Two Faraday cups and a beam profile monitor are installed for beam diagnosis. A control magnet after the first opening provides additional flexibility for beam control.

The vacuum measurement chamber is made of stainless steel 316 and mechanically polished from the inside and outside. It has 18 CF flanges for feedthroughs, at least one detector, a sample observation unit and a sample access, along with the individually designed short compact in-coupling system for the flexible connection of the beam tube to the vacuum measurement chamber.

During the assembly of the beam tube and the vacuum measurement chamber, particular attention is paid to avoiding stray fields in the beamline and in the detector region. Magnetic field measurements showed the vacuum meters (Pfeiffer Vacuum PKR 360), the (electropneumatic) valve actuators, and the magnetically mounted turbomolecular pumps as critical sources of undesirable fields.

In order to mitigate the influence of stray fields in the ion beam and the nuclear reaction products, such devices are mounted on extension flanges that provide a sufficient distance in order to obtain under 10 µT in the beam center line and in the measurement chamber. The fields are measured with a handheld magnetic compass having an effective resolution of 1 µT (digital resolution 0.01 µT). The stray field could no longer be detected at a distance of 450 mm for the turbomolecular pump, or 200 mm for the vacuum meters and actuators.

The beamline is mounted and aligned with the aid of a leveling camera. All flanges are centered about the ideal axis by ±1 mm, including the beamline, magnets, apertures and sample chamber on the table (see also FIG. 5).

After the centering, the vacuum measurement chamber is aligned with the aid of setting screws and a laser beam, which is irradiated 5 m away on the rear side of the distribution magnet, with an accuracy of $10^{-4°}$ against the beam axis. After the beam tube and vacuum measurement chamber assembly, the sample manipulator is installed in the measurement chamber. The precision achieved during assembly makes the fine adjustment of all parts possible in the next step with their individual fine adjustment screws.

Thermal drifts, which are relevant to relative beam spot movements, are evaluated by ambient measurements over a week in the summer. Room temperature variations were found to be in the order of up to 1 K/h. The steepest increase was typically observed from 10:00 AM to 12:00 noon. The overall temperature fluctuations between 8:00 AM and 8:00 PM remained within 2 K. The maximum assumed temperature difference is 1 K, since all metal components provide adequate thermal conductivity for equilibration. The measurement also showed changes in the relative humidity in the range of 30 to 70%. In order to avoid moisture-induced swelling, only metals were used for the entire support structure.

For long-term ion beam measurements, a change in position between the last diaphragm and the sample (both located on the same low-vibration table) is considered to be the relevant variable. Changes in distance are not relevant as they will be negligible compared to the focal length, which will be discussed in the next section.

The main problem is vertical displacements induced by thermal expansion of the support structures. The diaphragm is located on an aluminum rail, while the sample is arranged in a vacuum measurement chamber made of stainless steel on a sample manipulator comprising a cobalt-chromium-nickel alloy (Phynox). Assuming that the low-vibration table causes the same displacement for all parts mounted thereon, only the height of the beamline above the table is relevant, which is 150 mm. Considering the coefficient of thermal expansion of aluminum with $2.3*10^{-5}$ $K^{-1}$ reduced by the coefficient of thermal expansion of stainless steel with $1.0*10^{-5}K^{-1}$, a maximum displacement of 2 µm in the height could be calculated as the upper limit at a temperature difference of 1 K. In a realistic case with temperature conduction, the thermal expansion effect is assumed to be negligible, unless much smaller beam spots are realized.

D. Magnetic Focusing System

For a high-resolution ion beam analysis, a micro beam is required, which provides a maximum ion current in a minimum beam diameter. Beam focusing and beam diaphragms are required for this purpose. In the present exemplary embodiment, a triple quadrupole magnet consisting of three Oxford OM-56 microbeams with a 10 mm bore is installed at a distance of 123 mm between the last magnetic iron core and the sample.

For specific applications, a minimum distance of 100 mm can be realized by displacing the sample holder, but readjustment of the detectors is then required.

Since the microfocus operates with a convergent beam, an impingement angle distribution of up to 1.2° will exist with a maximum specified reduction of approximately 100 for a line focus and about 25 for a point focus, see FIG. 6. This can induce differences in the probing depth and energy loss of the projectiles in the sample, but at typical values of ≤0.3° this can typically be neglected compared to the geometric scattering caused by finite detector dimensions.

The magnets are operated by two highly stable power supply units with up to 3 V and 100 A, with <10 mA residual ripples and 5 ppm/K drifts. Vertical or horizontal lines or round ion beam spots can be produced by connecting the power supply units in different polarities and grouping.

In general, it must be taken into account that, due to the axial length of each magnet of 100 mm, the maximum reduction of the sample is achieved with very different excitations at each magnet. To compensate for this, the central magnet is connected to the two outer magnets with opposite polarity, and the end magnet is driven individually. The magnets can be set on the scale of ±1 to 2000 µm and <5° around the basic setting of their base plate (aluminum rail on the low-vibration table) by adjusting micrometer screws.

Prior to start-up, all magnets are centered on the beam axis by connecting each individual magnet in both polarizations, and reducing their horizontal and vertical beam deflection and the rhombic focus effect to zero with the aid of these micrometer screws.

The beam spot on the sample is observed using the sample observation camera and a scintillating $LiAlO_2$ mono-crystal target irradiated with a 3 meV proton beam of approximately 1 nA. The exact determination of the optimum magnetic currents and focusing is described in the next section.

E. Positioning of the Samples or of the Sample Manipulator

An in-vacuum sample manipulator allows imaging of the samples. The sample manipulator offers manipulation ranges of ±25 mm in three axes with a positioning accuracy of 10 nm and a position resolution of 1 nm. This design offers several advantages over ion beam scanning, since spatial calibration is not required, the ion beam can always remain in the ideal beam axis, and a smaller magnet-sample distance (no scanning magnet) and a larger scanning range are achieved.

On the other hand, a complex sample manipulator with non-magnetic materials and motors and a dynamic range of motion of approximately $10^6$ with movements speeds of nm/s to cm/s is required.

The linear movement of the sample manipulator is driven by piezoelectric motors. A significant handling advantage is the overload tolerance of the piezo motors, which prevents damage to the motor if excessive force is applied during assembly. The sample manipulator is calibrated and referenced by its internal position sensors, which were verified by the telecentric camera.

The weight of the sample manipulator is assumed to be 300 g to 600 g (150 g motor power), including the sample holder. This weight tolerance range was selected for the typical samples, but can be tailored to other requirements by changing the counteracting spring (here 450 g counterweight) of the sample manipulator. At the sample manipulator, various types of sample holders can be installed on a self-centering adapter to correspond to either many small samples or a few larger samples.

The angles of rotation and inclination were aligned by laser reflection from a highly polished sample mounted on the sample holder. For this purpose, a laser beam is introduced into the rear side of the switching magnet. The laser beam travels through the 5 m ion beamline, through a 2 mm diaphragm onto the vacuum measurement chamber and is then reflected by the mirror mounted on the sample holder. The angles of inclination and rotation of the sample manipulator are corrected until the laser is reflected back at a distance of 100 mm through the 2 mm entrance hole of the ruler. This leads to an angular accuracy of the alignment of ±0.2°.

The ion beam impingement angle thus has the same accuracy, but the detector has an additional uncertainty resulting from the relative alignment uncertainty of the linear and of the detector holder of ±1 mm, for example. Such tolerances in the ion beam impingement angle can lead to deviations of the measurement results in the order of magnitude of 0.1%.

Moreover, the sample manipulator system was used for the direct electrical contacting of samples under vacuum, e.g., open battery cells. The installation of a contact needle in front of the sample plane makes it possible to directly observe and video record the contact point and possible effects on the sample. Moving the sample manipulator in the direction of the contact needle results in reliable contacts with contact resistances in the order of magnitude of 1Ω. The contact pressure was varied by controlling the sample manipulator position on the mm scale with little effect on the detector angle (~31 mm sample-detector distance). Additional electrical contacts of the samples are possible via a vacuum feedthrough, which makes a multitude of in-situ experiments possible with high flexibility in terms of voltage, current and frequency.

For the final step of creating the focusing magnetic currents, various groups of the USAF 1951 test image were actuated by the sample manipulator. The magnetic currents were increased, and the magnitude of the beam fluorescence was compared to the known line width of the test image groups. Smaller line groups were sought until no more light was visible, aside from the metalized portion. This procedure was repeated for horizontal and vertical line groups, resulting in an accuracy of beam size determination of approximately 5% due to the finite inter-group differences.

The method makes it possible to determine the beam size even for beam spots smaller than the optical resolution of the camera, and for beams with high current density. The minimum spot size was determined to be $50\times35$ µm$^2$ with an object aperture of $1200\times1200$ µm$^2$. Accordingly, a reduction of 24 or 34 has been achieved.

F. Detector System for the Ion Beam Analysis

For the detection of charged particles for NRA and RBS, two silicon detectors were installed with a reaction angle of 165° to separate different particle types. Light-induced background signals in the detectors are avoided by completely covering all windows during the measurement. A high resolution detector with 11 keV FWHM at a 2 µs rise time (or 16 keV at 0.6 µs), a size of 50 mm$^2$ and a nominal active thickness of 100 µm detects protons up to about 3.5 MeV and alphas up to about 15 MeV. The second detector has an active thickness of 1500 µm, a size of 150 mm$^2$ and a FWHM resolution of 22 keV at a rise time of 1.4 µs.

This second detector is equipped with a stop film made of 25 µm thick polyimide coated at 30 nm Al to block incident light and alpha particles below about 5 MeV. Both detectors may be equipped with apertures in the form of a segment of the 165° circle to limit count rates and geometric scattering. The aperture has an opening of 4 mm or 1.5 mm. The remaining detector solid angle was experimentally calibrated, using the 7Li (p, α) 4He reaction, to an accuracy of better than 1% for all instances with, for example, 3.52±0.04 times reduced solid angles, for a 1.5 mm aperture at the high-resolution detector.

For the PUCE analysis, a KETEK AXAS-D silicon drift detector with an active thickness of 450 volts counts the emitted X-rays. In order to block incident charged particles up to 4 MeV protons and 15 MeV alphas, the detector is equipped with a 200 μm thick graphite foil of 1.2 g/cm$^3$ and 8 μm beryllium. The detector observes the samples from an angle of 45° from a connection in the sample plane. The distance with respect to the sample can be set from 30 to 200 mm to optimize count rates. The detector is calibrated by K and L lines made of high purity W, Mo and Y targets. Its H factor (energy-dependent sensitivity) is determined by the same samples in combination with the normalization by the respective RBS signals.

A quantitative analysis of the sample composition by ion beam analysis requires the determination of the Particle*Sr value. This value consists of the solid angle of the detector and the current and the charge of the incident ion. The ion current was measured using a Keithley 6487 Pico Ampere meter by software logging and integration with an accuracy of better than 0.1%. The relevant error in the accumulated charge is due to the emission of secondary electrons by the ion beam splitter. In order to suppress such secondary electrons, an electric field is required, which drives them back onto the sample.

In the present design, insulation of the sample holder with respect the surrounding structures was installed. The (metallic) sample holder itself was biased against ground using the voltage sources of the Pico ampere meter. This biasing scheme allows maximum suppression of secondary electrons, since it acts against all directions. The suppression of secondary electrons for a correct measurement of the incident ion current is tested using a 3 MeV 4He beam on a W sample. The apparent incident ion current is measured for different sample biases using the Pico ampere meter. The measured current stabilizes above 60 V, indicating complete suppression of the secondary electrons, but beam stability was not sufficient for an accuracy of <10%.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A device for an MeV-based ion beam analysis of a sample, comprising:
   a vacuum measurement chamber, the vacuum measurement chamber including:
      at least one detector, the at least one detector including a first detector, and
      a sample observation unit;
   a vacuum system configured to generate a vacuum within the vacuum measurement chamber;
   an ion beam tube configured to transmit an ion beam;
   a focusing system configured to focus the ion beam transmitted via the ion beam tube;
   a sample transfer system, the sample transfer system including a sample manipulator having a sample holder configured to receive at least one sample; and
   an in-coupling system configured to connect the ion beam tube to the vacuum measurement chamber in a vacuum-tight manner, the in-coupling system including:
      an ion beam vacuum feedthrough formed in an exterior wall of the in-coupling system and configured to receive the ion beam tube therein,
      a receiver configured to receive the first detector,
      a receiver configured to receive the sample observation unit, and
      a receiver configured to receive the sample transfer system,
   wherein the in-coupling system provides a direct mechanical connection between the focusing system configured to focus the ion beam, the first detector, and the sample observation unit.

2. The device according to claim 1, wherein the in-coupling system is an articulated vacuum feedthrough.

3. The device according to preceding claim 2, wherein the in-coupling system includes a two-stage articulated joint having lateral and transverse flexibility.

4. The device according to claim 1, a wherein the first detector is configured to detect at least two particle types.

5. The device according to claim 1, wherein the first detector is a circular detector having a central bore.

6. The device according to claim 1, wherein the sample observation unit includes a telecentric camera and a deflection mirror.

7. The device according to claim 1, further comprising a distance corrector configured to correct a distance between a sample surface and the first detector in the installed state.

8. The device according to claim 1, wherein the vacuum measurement chamber is arranged in an alignable manner in translation and rotation with respect to the ion beam using a plurality of stages of increasingly finer adjustment screws and laser reflection.

9. The device according to claim 1, wherein the vacuum measurement chamber includes a circular segment aperture arranged between the sample and the first detector.

10. The device according to claim 1, wherein the vacuum system includes vacuum measuring and vacuum analysis devices.

11. The device according to claim 1, wherein the sample manipulator is a non-magnetic sample manipulator.

12. The device according to claim 1, wherein the sample manipulator is a multi-axis sample manipulator including a piezoelectric motor and integrated path and/or position sensors.

13. The device according to claim 1, wherein the housing of the in-coupling system is formed from non-magnetic stainless steel, wherein the in-coupling system includes an O-ring seal disposed at the ion-beam vacuum feedthrough, wherein the sample observation unit is a camera, wherein the receiver configured to receive the sample observation unit is a camera mount, wherein the receiver configured to receive the first detector is a detector mount, and wherein the receiver configured to receive the sample transfer system is a mounting rail.

14. A device for an MeV-based ion beam analysis of a sample, comprising:
- a vacuum measurement chamber, the vacuum measurement chamber including:
  - a detector, and
  - a sample observation system having a telecentric camera and a deflection mirror;
- a vacuum system configured to generate a vacuum within the vacuum measurement chamber;
- an ion beam tube configured to transmit an ion beam;
- a focusing system configured to focus the ion beam transmitted via the ion beam tube;
- a sample transfer system, the sample transfer system including a sample manipulator having a sample holder configured to receive at least one sample; and
- an in-coupling system configured to connect the ion beam tube to the vacuum measurement chamber in a vacuum-tight manner, the in-coupling system including:
  - an ion beam vacuum feedthrough,
  - a receiver configured to receive the detector,
  - a receiver configured to receive the sample observation unit, and
  - a receiver configured to receive the sample transfer system,
- wherein the in-coupling system provides a direct mechanical connection between the focusing system configured to focus the ion beam, the detector, and the sample observation unit.

15. The device according to claim 14, further comprising one or more additional detectors.

16. The device according to claim 14, wherein the detector is a circular detector having a central bore.

17. The device according to claim 14, wherein the vacuum measurement chamber is arranged in an alignable manner in translation and rotation with respect to the ion beam using a plurality of stages of increasingly finer adjustment screws and laser reflection.

18. A device for an MeV-based ion beam analysis of a sample, comprising:
- a vacuum measurement chamber, the vacuum measurement chamber including:
  - a detector, and
  - a sample observation system;
- a vacuum system configured to generate a vacuum within the vacuum measurement chamber;
- an ion beam tube configured to transmit an ion beam;
- a focusing system configured to focus the ion beam transmitted via the ion beam tube;
- a sample transfer system, the sample transfer system including a sample manipulator having a sample holder configured to receive at least one sample; and
- an in-coupling system configured to connect the ion beam tube to the vacuum measurement chamber in a vacuum-tight manner, the in-coupling system including:
  - an ion beam vacuum feedthrough,
  - a receiver configured to receive the detector,
  - a receiver configured to receive the sample observation unit, and
  - a receiver configured to receive the sample transfer system,
- wherein the in-coupling system provides a direct mechanical connection between the focusing system configured to focus the ion beam, the detector, and the sample observation unit, and
- wherein the vacuum measurement chamber is arranged in an alignable manner in translation and rotation with respect to the ion beam using a plurality of stages of increasingly finer adjustment screws and laser reflection.

19. The device according to claim 18, wherein the in-coupling system includes a two-stage articulated joint having lateral and transverse flexibility.

20. The device according to claim 18, further comprising one or more additional detectors.

* * * * *